(12) United States Patent
Kim et al.

(10) Patent No.: US 9,484,258 B1
(45) Date of Patent: Nov. 1, 2016

(54) METHOD FOR PRODUCING SELF-ALIGNED VIAS

(71) Applicant: GLOBALFOUNDRIES Inc., Grand Cayman (KY)

(72) Inventors: Ryan Ryoung-han Kim, Albany, NY (US); Wenhui Wang, San Jose, CA (US); Lei Sun, Albany, NY (US); Erik Verduijn, Rensselaer, NY (US); Yulu Chen, Troy, NY (US)

(73) Assignee: GLOBALFOUNDRIES INC., Grand Cayman (GB)

( * ) Notice: Subject to any disclaimer, the term of this patent is extended or adjusted under 35 U.S.C. 154(b) by 0 days.

(21) Appl. No.: 15/071,247

(22) Filed: Mar. 16, 2016

(51) Int. Cl.
*H01L 21/768* (2006.01)
*H01L 23/528* (2006.01)

(52) U.S. Cl.
CPC ... *H01L 21/76897* (2013.01); *H01L 21/76808* (2013.01); *H01L 21/76816* (2013.01); *H01L 21/76819* (2013.01); *H01L 21/76835* (2013.01); *H01L 21/76843* (2013.01); *H01L 23/528* (2013.01)

(58) Field of Classification Search
CPC .................. H01L 21/76897; H01L 21/76816; H01L 23/528
See application file for complete search history.

(56) References Cited

U.S. PATENT DOCUMENTS

2014/0038412 A1* 2/2014 Hu .................... H01L 21/76811
438/689

OTHER PUBLICATIONS

Wang et al. "SAV Using Selective SAQP/SADP", filed on Mar. 16, 2016, Entire prosecution history of U.S Appl. No. 15/071,255.

* cited by examiner

*Primary Examiner* — Amar Movva
(74) *Attorney, Agent, or Firm* — Ditthavong & Steiner, P.C.

(57) ABSTRACT

A method for producing self-aligned vias (SAV) is provided. Embodiments include forming a ILOS layer over a dielectric layer; forming pairs of spacers over the ILOS layer, each pair of spacers having a first filler formed between adjacent spacers, and a second filler formed between each pair of spacers; forming and patterning a first OPL to expose one second filler, spacers on opposite sides of the one second filler, and a portion of the first filler adjacent each of the exposed spacers; removing the one second filler to form a SAV, and SAV etching into the ILOS layer; forming a second OPL over the first OPL and in the SAV to form a SAV plug; removing OPL layers and etching into the ILOS layer down to the dielectric layer; forming a third OPL layer in spaces between the TEOS layer; and removing the SAV plug.

20 Claims, 12 Drawing Sheets

METHOD FOR PRODUCING SELF-ALIGNED VIAS

TECHNICAL FIELD

The present disclosure relates to a method of forming a self-aligned via (SAV). In particular, the present disclosure relates to forming a SAV in semiconductor devices in the 7 nanometer (nm) technology node and beyond.

BACKGROUND

With conventional lithography processes, the problem of SAV process margin loss occurs when there is shrinkage in the metal pitch. With conventional SAV processes, a metal hardmask is used to produce the SAV. However, a SAV pattern edge cannot be extended to an adjacent metal. This loss of process margin occurs when the metal pitch shrinks in the 7 nm technology node due to the limits of current lithography processes in terms of critical dimension uniformity (CDU) and overlay alignment (OVL).

A need therefore exists for methodology enabling increased process margins in terms of critical dimensions and edge placement margins during SAV formation.

SUMMARY

An aspect of the present disclosure is a method for enabling SAV patterning for tighter metal pitch and improving trench profile control in semiconductor manufacturing.

In certain aspects a TiN hardmask is etches after trench hardmask etch and a SAV plug is formed within a via hardmask. Other aspects of the present disclosure include no SAV plug removal post trench etch which minimizes the damage of the trench dielectric. Thus, the trench etch is performed after the SAV plug removal and SAV via etch.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a tetraethyl orthosilicate (TEOS) layer over a dielectric layer; forming pairs of spacers over the TEOS layer, each pair of spacers having a first filler formed between adjacent spacers, and a second filler formed between each pair of spacers; forming and patterning a first organic planarization layer (OPL) to expose one second filler, spacers on opposite sides of the one second filler, and a portion of the first filler adjacent each of the exposed spacers; removing the second filler exposed during patterning of the first OPL to form a self-aligned via (SAV), and SAV etching into the TEOS layer; forming a second OPL over the first OPL and in the SAV to form a SAV plug; removing the first and second OPL layers above an upper surface of the SAV plug; removing remaining first and second fillers; etching into the TEOS layer down to the dielectric layer; forming a third OPL layer in spaces between the TEOS layer; and removing the SAV plug.

Aspects of the present disclosure include the dielectric layer being a low-K dielectric material. Other aspects include forming a (TiN) layer between the dielectric layer and the TEOS layer. Additional aspects include etching through the SAV down into the dielectric layer subsequent to removing the SAV plug. Other aspects include removing the third OPL layer with a SAV etch. Certain aspects include removing the SAV plug with a SAV etch. Further aspects include performing a dual damascene etch after removal of the SAV plug. Additional aspects include removing the first OPL and second OPL layers down to the upper surface of the SAV plug by etching or planarizing. Certain aspects include the first filler including amorphous silicon. Other aspects include the second filler including titanium oxide ($TiO_x$). Still further aspects include the SAV plug including silicon oxide (SiO).

Another aspect of the present disclosure is a method including forming a metal layer over a dielectric layer; forming pairs of spacers over metal layer, each pair of spacers having a first filler formed between adjacent spacers, and a second filler between each pair of spacers; forming a first OPL over the pairs of spacers; removing a portion of the first OPL to expose one second filler, spacers on each side of the second filler, and a portion of the first filler on each side of the spacers; removing the one second filler exposed during patterning of the first OPL to form a SAV; forming a SAV plug in the SAV; removing remaining first and second fillers; etching into the metal layer; depositing a second OPL in spacers between the metal layer over the dielectric layer; removing the SAV plug; and SAV etching into the dielectric layer.

Aspects include the dielectric layer being a low-K dielectric material. Other aspects include planarizing down to an upper surface of the pairs of spacers after forming the SAV plug. Additional aspects include, prior to forming the pairs of spacers, forming TiN layer over the dielectric layer; and forming a TEOS layer over the TiN layer. Certain aspects include performing a dual damascene etch after removing the SAV plug. Other aspects include the first filler including amorphous silicon. Additional aspects include the second filler including $TiO_x$. Still further aspects include the SAV plug including SiO.

Yet another aspect includes a method including forming a TiN layer over a low-k dielectric layer; forming a IEOS layer over the TiN layer; forming pairs of spacers over the IEOS layer, each pair of spacers having a first filler formed between adjacent spacers, and second filler between each pair of spacers; forming and patterning a first OPL to expose one second filler, spacers on each side of the one second filler, and a portion of the first filler on each side of the spacers; removing the second filler exposed during patterning of the first OPL to form a SAV; forming a second OPL over the first OPL and in the SAV to form a SAV plug; removing remaining first and second fillers; etching into the TiN layer down to the dielectric layer to form stacks of IEOS and TiN layers; forming a third OPL layer between the stacks of TEOS and TiN layers; removing the SAV plug with a SAV etch; and performing a dual damascene etch.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accom- FIGS. 1 through 11 schematically illustrate a process flow to produce a SAV in a semiconductor device, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of process margin loss during SAV formation. In accordance with embodiments of the present disclosure, a method is provided that increases the process margin for SAV processing in terms of SAV critical dimension uniformity and increased edge placement margin.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
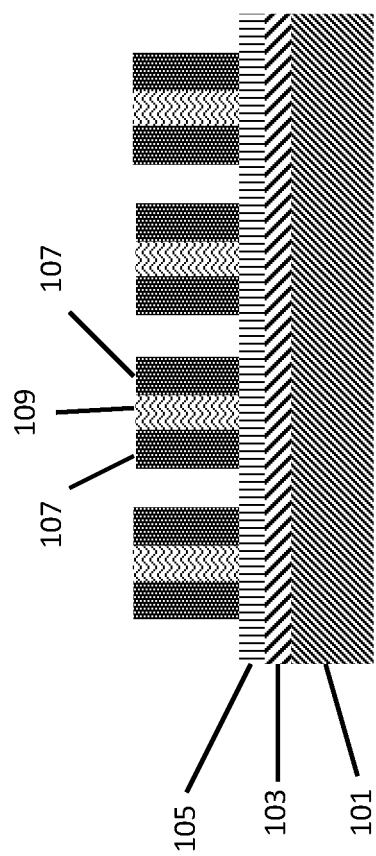
Figure 2:
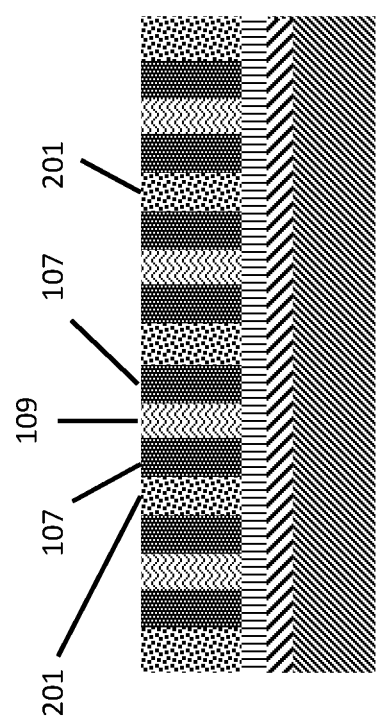

Adverting to FIG. 1, a dielectric layer 101 is shown with a TiN layer 103 and TEOS layer 105 deposited on an upper surface of the dielectric layer 101. The dielectric layer 101 can include ultra low K (ULK) materials with dielectric constant K close to or less than 2.7. The ILOS layer 105 is deposited by chemical vapor deposition (CVD) to a thickness of 10 to 30 nm. The TiN layer 103 is deposited by a sputtering or atomic layer deposition (ALD) to a thickness of 15 to 30 nm. Pairs of spacers 107 are formed over the TiN layer 103 and TEOS layer 105. Each spacer 107 is formed of a material such as silicon oxide (SiO) and includes a first filler 109 formed between each pair of spacers 107. The first filler 109 includes a mandrel filler material such as amorphous silicon. In FIG. 2, a second filler 201 is formed in the spaces between each pair of spacers 107. The second filler 201 can include a mandrel filler material such as $TiO_x$.

Figure 3:
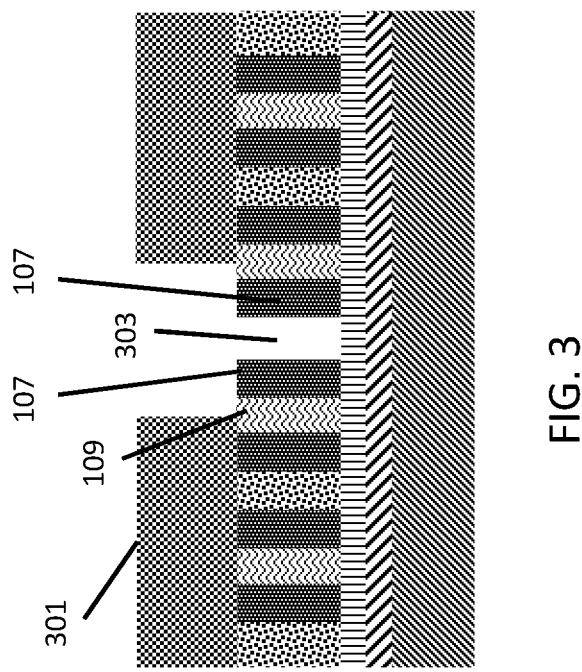

Adverting to FIG. 3, an OPL 301 is deposited and selectively etched to expose one of the second fillers 201 (FIG. 2), spacers 107 on opposite sides of the second filler 201, and a portion of the first filler 109 adjacent each of the exposed spacers 107. The OPL can include a material such as ODL-401 (commercially available from Shin-etsu Chemical, Co., Ltd) and be formed to a thickness of 50 to 150 nm. The exposed second filler 201 is shown removed in FIG. 3, after the SAV patterning is performed to form a SAV 303 between spacers 107. In FIG. 3, the OPL 301 is formed and etched to expose a portion of the first filler 109 adjacent to each of the exposed spacers 107. In this example, the OPL 301 covers half of the exposed first filler 109. Adverting to FIG. 4, a SAV etch is performed to extend SAV 303 through the TEOS layer 105 down to the TiN layer 103. In certain examples, the SAV etch can extend the SAV 303 into the TiN layer 103.

Figure 4:
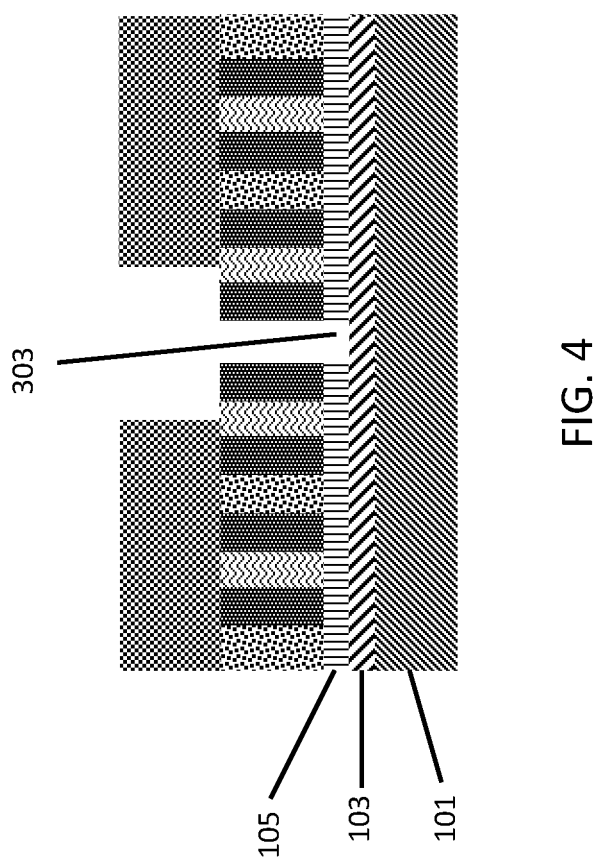
Figure 5:
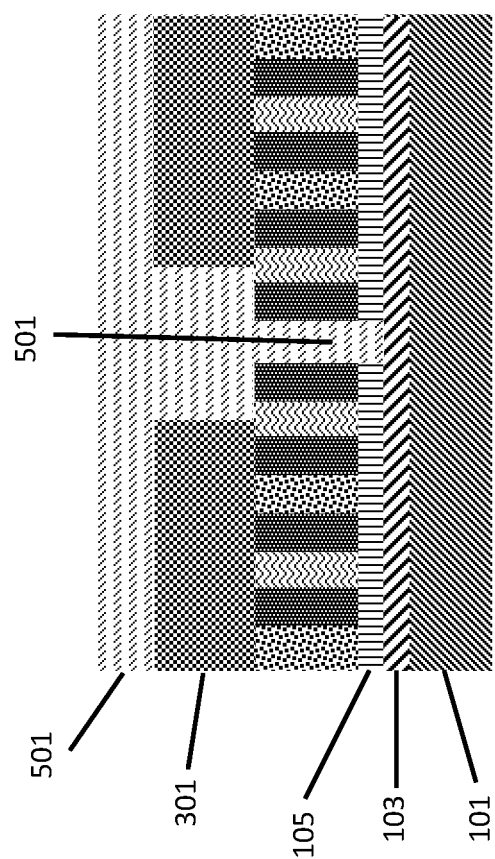
Figure 6:
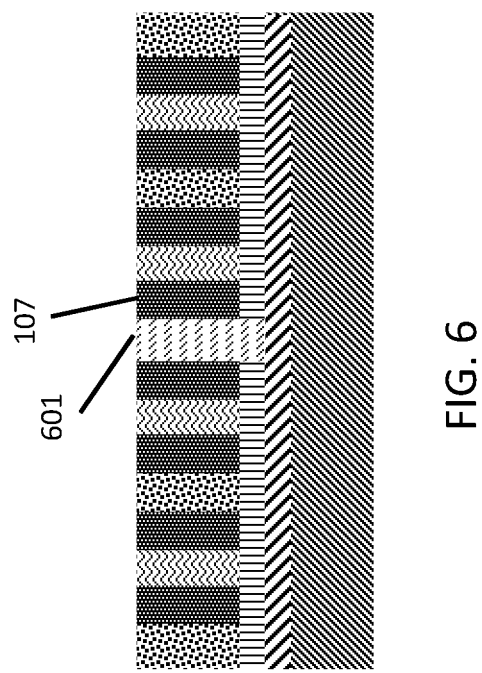

Adverting to FIG. 5, an OPL 501 is deposited over the OPL 301 and fills the SAV 301 (FIG. 4). The OPL 501 is formed of a material such as ODL-401. The OPL 501 fills the SAV 301 down into the TEOS layer 105 in this example, but could extend down into the TiN layer 103 in certain examples. As shown in FIG. 6, the OPL 501 and the OPL 301 above an upper surface of spacers 107 are removed by etch back or CMP to form SAV plug 601. In this example, the SAV plug 601 has an upper surface that is even with the upper surface of the spacers 107. In certain examples, the OPL 301 is removed and only a new layer of OPL 501 is present However, as depicted in FIG. 6, OPL 301 can remain and then the OPL 501 can be formed over the OPL 301. In this alternative example, the OPL 301 and 501 can be same material or can be different ones.

Figure 7:
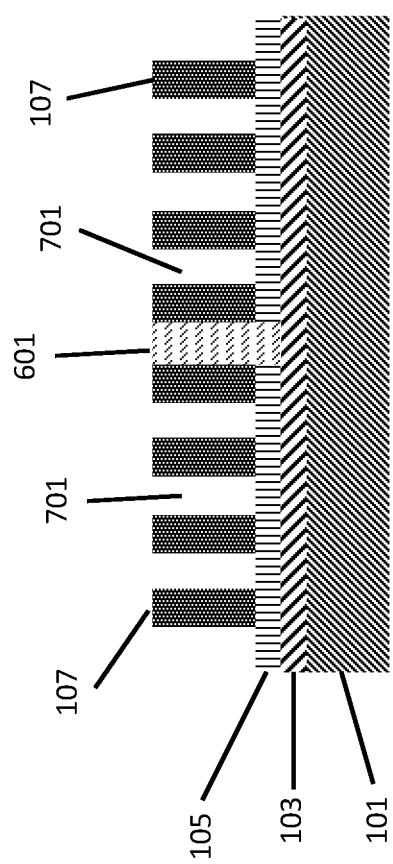
Figure 8:
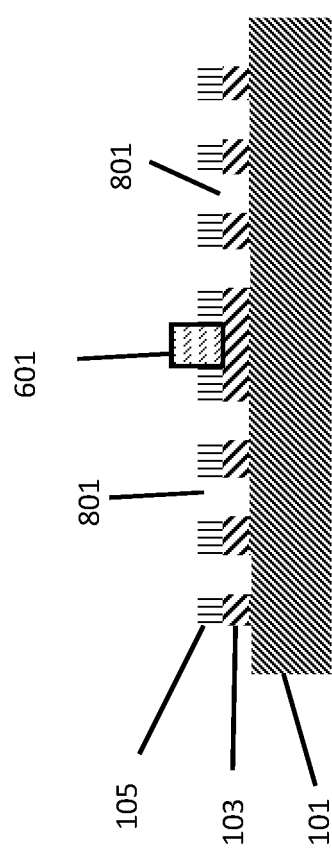

Adverting to FIG. 7, the first filler 109 and second filler 201 are removed by a selective etching such as chlorine ($Cl_2$) or sulfur hexafluoride ($SF_6$) etch to form openings 701 between spacers 107. The SAV plug 601 partially remains after the selective etching. In FIG. 8, an etching step is performed using the spacers 107 and SAV plug 601 as a mask. Then spacers 107 and a portion of the SAV plug 601 are removed following the etching step. Openings 801 extend down to the dielectric layer 101 in between the etched TEOS layer 105 and TiN layer 103.

Figure 9:
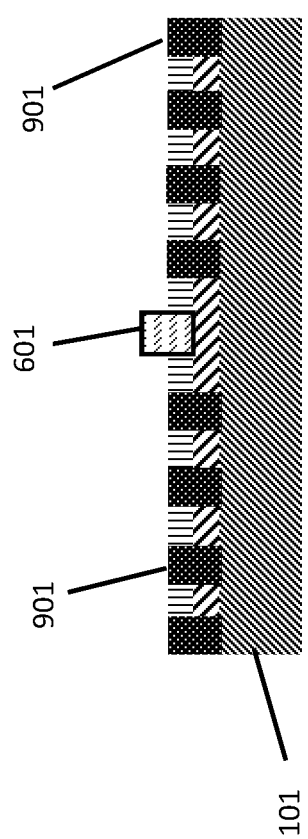
Figure 10:
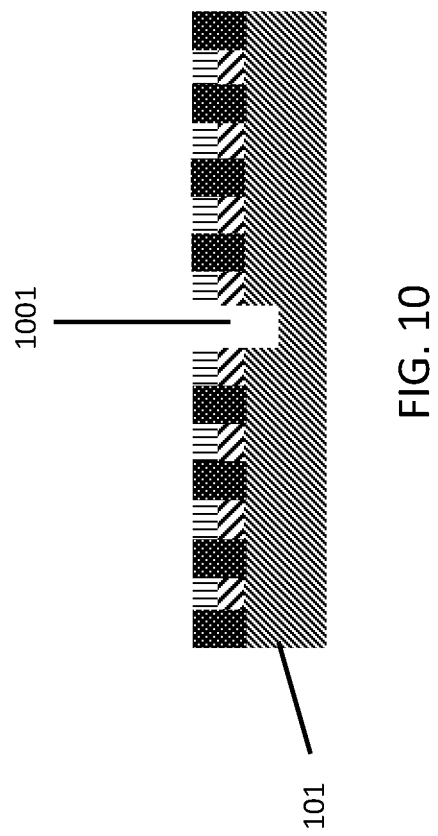

Adverting to FIG. 9, a flowable silicon oxide 901 is deposited in openings 801 and is etch selective to TiN layer 103 and the SAV plug 601. The excess oxide 901 is removed to expose SAV plug 601. In FIG. 10, the SAV plug 601 is removed and a SAV etch is performed to extend the opening 1001 into the dielectric layer 101. The oxide layer is removed after the SAV plug 601 is removed. The objective is to remove plug 601 and maintain material in openings 801. If the ODL have the same etch rate, SAV plug 601 will be opened while some OPL will remain in openings 801. If openings 801 are filled with the flowable silicon oxide 901, then an organic etch can be performed to remove 601 while not removing oxide 901. In an alternative process, OPL 901 and SAV plug 601 can each be formed of OPL with different etch rates. One of the OPLs will be more etch resistant than the other. For example, ODL-401 and ODL-102 can be used, and ODL-401 has a faster etch rate than ODL-102.

Figure 11:
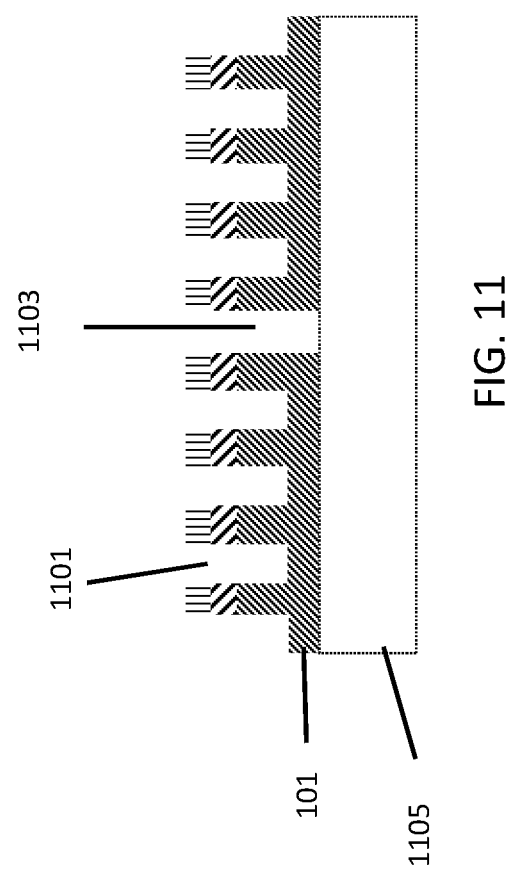

In FIG. 11, additional processing such as a dual damascene etching can be performed to extend the openings 1101 into the dielectric layer 101 and to extend opening 1103 down to a layer 1105 below the dielectric layer 101. The openings 1101 and 1103 can than be filled with a metal such as copper (Cu) for electrical connection.

Figure 12:
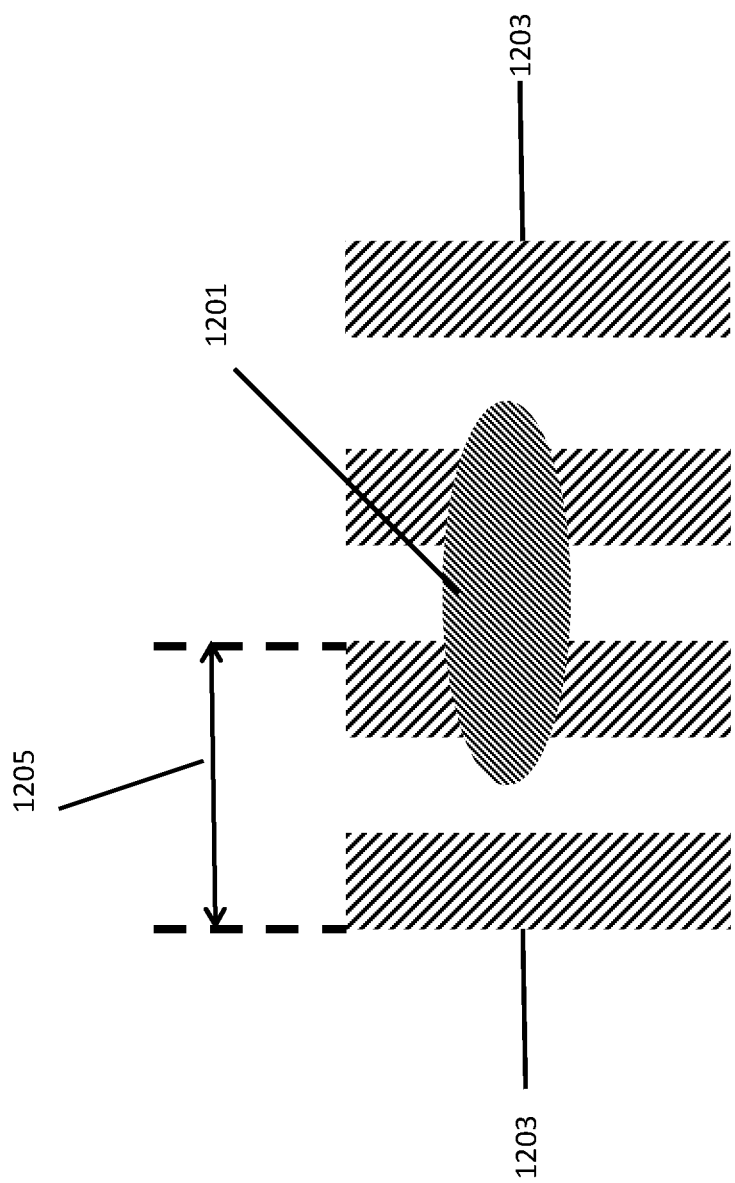
FIG. 12 illustrates a SAV edge placement margin, in accordance with an exemplary embodiment.

Adverting to FIG. 12, an SAV pattern 1201 is illustrated between metal lines 1203. The double arrow line 1205 in this example represents the SAV edge placement margin. For a 36 nm metal pitch, the edge placement budget can be increased from ±9 nm to ±27 nm. This increased placement margin improves critical dimension uniformity and overlay alignment. The methodology described herein is applicable to back end of line (BEOL) processing using lithography techniques including self-aligned double patterning (SADP) and self-aligned quadruple patterning (SAQP).

The embodiments of the present disclosure can achieve several technical effects, including improved trench profile control and selective SAV with minimal damage to the trench dielectric layer. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for 7 nm technology node devices and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
forming a tetraethyl orthosilicate (TEOS) layer over a dielectric layer;
forming pairs of spacers over the TEOS layer, each pair of spacers having a first filler formed between adjacent spacers, and a second filler formed between each pair of spacers;
forming and patterning a first organic planarization layer (OPL) to expose one second filler, spacers on opposite sides of the one second filler, and a portion of the first filler adjacent each of the exposed spacers;
removing the one second filler exposed during patterning of the first OPL to form a self-aligned via (SAV), and SAV etching into the TEOS layer;
forming a second OPL over the first OPL and in the SAV to form a SAV plug;
removing the first and second OPL layers above an upper surface of the SAV plug;
removing remaining first and second fillers;
etching into the TEOS layer down to the dielectric layer;
forming a third OPL layer in spaces between the TEOS layer; and
removing the SAV plug.

2. The method according to claim 1, wherein the dielectric layer is a low-k dielectric material.

3. The method according to claim 1, further comprising:
forming a titanium nitride (TiN) layer between the dielectric layer and the TEOS layer.

4. The method according to claim 3, comprising:
etching through the SAV down into the dielectric layer subsequent to removing the SAV plug.

5. The method according to claim 1, further comprising:
removing the third OPL layer with a SAV etch.

6. The method according to claim 1, comprising:
removing the SAV plug with a SAV etch.

7. The method according to claim 6, further comprising:
performing a dual damascene etch after removal of the SAV plug.

8. The method according to claim 1, comprising:
removing the first OPL and second OPL layers down to the upper surface of the SAV plug by etching or planarizing.

9. The method according to claim 1, wherein the first filler comprises amorphous silicon.

10. The method according to claim 1, wherein the second filler comprises titanium oxide ($TiO_x$).

11. The method according to claim 10, wherein the SAV plug comprises silicon oxide (SiO).

12. A method comprising:
forming a metal layer over a dielectric layer;
forming pairs of spacers over metal layer, each pair of spacers having a first filler formed between adjacent spacers, and a second filler between each pair of spacers;
forming a first organic planarization layer (OPL) over the pairs of spacers;
removing a portion of the first OPL to expose one second filler, spacers on each side of the second filler, and a portion of the first filler on each side of the spacers;
removing the one second filler exposed during patterning of the first OPL to form a self-aligned via (SAV);
forming a SAV plug in the SAV;
removing remaining first and second fillers;
etching into the metal layer;
depositing a second OPL in spacers between the metal layer over the dielectric layer;
removing the SAV plug; and
SAV etching into the dielectric layer.

13. The method according to claim 12, wherein the dielectric layer is a low-k dielectric material.

14. The method according to claim 12, further comprising:
after forming the SAV plug, planarizing down to an upper surface of the pairs of spacers.

15. The method according to claim 12, further comprising:
prior to forming the pairs of spacers, forming a titanium nitride (TiN) layer over the dielectric layer; and forming a tetraethyl orthosilicate (TEOS) layer over the TiN layer.

16. The method according to claim 12, further comprising:
performing a dual damascene etch after removing the SAV plug.

17. The method according to claim 12, wherein the first filler comprises amorphous silicon.

18. The method according to claim 12, wherein the second filler comprises titanium oxide ($TiO_x$).

19. The method according to claim 12, wherein the SAV plug comprises silicon oxide (SiO).

20. A method comprising:
forming a titanium nitride (TiN) layer over a low-k dielectric layer;
forming a tetraethyl orthosilicate (TEOS) layer over the TiN layer;
forming pairs of spacers over the TEOS layer, each pair of spacers having a first filler formed between adjacent spacers, and second filler between each pair of spacers;
forming and patterning a first organic planarization layer (OPL) to expose one second filler, spacers on each side of the one second filler, and a portion of the first filler on each side of the spacers;
removing the second filler exposed during patterning of the first OPL to form a self-aligned via (SAV);
forming a second OPL over the first OPL and in the SAV to form a SAV plug;
removing remaining first and second fillers;
etching into the TiN layer down to the dielectric layer to form stacks of TEOS and TiN layers;
forming a third OPL layer between the stacks of TEOS and TiN layers;
removing the SAV plug with a SAV etch; and
performing a dual damascene etch.

* * * * *